(12) United States Patent
Onitsuka

(10) Patent No.: US 6,869,491 B2
(45) Date of Patent: Mar. 22, 2005

(54) BONDING METHOD

(75) Inventor: Yasuto Onitsuka, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/697,581

(22) Filed: Oct. 30, 2003

(65) Prior Publication Data
US 2004/0129364 A1 Jul. 8, 2004

(51) Int. Cl.[7] .............................................. B32B 31/20
(52) U.S. Cl. .................... 156/64; 156/299; 156/300; 29/832; 29/833; 29/834; 29/734
(58) Field of Search ........................ 156/64, 358, 360, 156/361, 362, 297, 299, 300, 538, 539, 295; 29/832, 833, 834, 738, 739, 836

(56) References Cited

U.S. PATENT DOCUMENTS

2001/0032030 A1 * 10/2001 Nakahara et al. ........... 700/114
2002/0004980 A1 * 1/2002 Onitsuka .................... 29/832

FOREIGN PATENT DOCUMENTS

JP 2003-59975 2/2003

* cited by examiner

Primary Examiner—Chris Fiorilla
Assistant Examiner—George Koch
(74) Attorney, Agent, or Firm—Pearne & Gordon LLP

(57) ABSTRACT

In a bonding method in which two display panels 7A, 7B are held by the two panel holding portions 31a, 31b provided on the panel support table 31 positioned by the XYθ table 30 so as to position the first pressure bonding head 25A and the second pressure bonding head 25B for conducting pressure bonding individually, according to the result of positional detection of the camera 37 and the recognizing portion 65, the display panel 7A is positioned to the first pressure bonding head and an object of pressure bonding is bonded by pressure. In this pressure bonding step, under the condition that a state of holding the display panel 7A is released, the display panel 7B is positioned to the second pressure bonding head 25B.

5 Claims, 10 Drawing Sheets

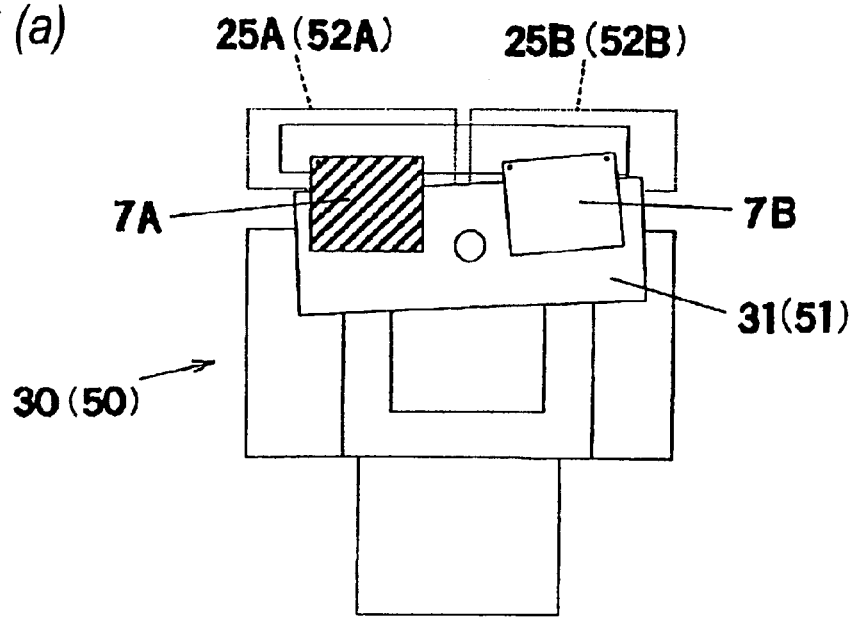
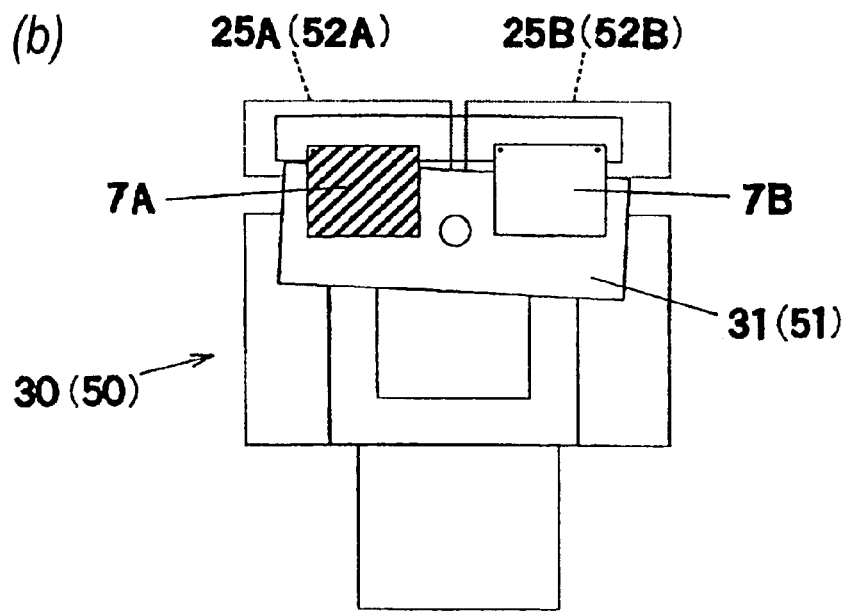

BONDING METHOD

BACKGROUND OF THE INVENTION

The present invention relates to a bonding method of mounting and bonding a chip to a board such as a display panel.

A chip for a driver is mounted on a board such as a display panel. This mounting work is conducted in such a manner that the chip is mounted at a chip mounting position of an edge portion of the board via adhesive, and this chip is pressed to the board so that it can be bonded. Recently, in order to enhance the production efficiency, there is provided a bonding device capable of simultaneously conducting the bonding work on a plurality of boards at each station of bonding.

For example, in the case of a bonding device in which the chip is fixed by ACF (anisotropic conductive film), a plurality of working heads are provided in the ACF bonding stage in which an ACF tape is bonded to the edge portion of the board, in the provisional pressure-bonding stage in which the chip is mounted on this ACF tape and provisionally pressure-bonded and in the final pressure-bonding stage in which ACF is hardened and fixed when heat and a load are given to the chip provisionally bonded by pressure. The same work is conducted in parallel by the plurality of working heads on the plurality of boards.

In this device, the board is positioned by the centering step before the board is conveyed into the bonding device. Therefore, the plurality of boards are conveyed into the working stage under the condition that the relative positions of the plurality of boards are accurately adjusted. In each working stage, these boards are held on the same board support table, and these boards are recognized under this condition so that the positions are detected. When the board support table is moved according to the result of positional detection, the plurality of boards are positioned with respect to the working heads by the same positioning motion.

However, in the conventional bonding method in which the bonding device having a plurality of working heads is used, positions of the boards deviate, and the following problems may be encountered. As described above, it is presupposed that the relative positions of the boards are accurately adjusted by centering conducted before the boards are conveyed into the working stage. However, the relative positions of all boards are not necessarily accurately adjusted at all times. In some cases, the boards are conveyed into the working stage while the positions are deviating from predetermined positions for some reasons.

In this case, concerning one board, it can be accurately positioned to the working head when the board is positioned according to the result of positional detection obtained by recognition. However, concerning the other boards, due to the aforementioned positional deviation, it is impossible to accurately conduct positioning by the same positioning motion.

In the conventional bonding method, the position of each board is detected at each working stage. In the case where a positional deviation is caused as a result of the detection and the relative position exceeds an allowable range, a worker is obliged to stop operation of the device and manually correct the position. Therefore, each time the positional deviation occurs, it is necessary to stop the device and manually correct the relative position, which deteriorates the production efficiency.

SUMMARY OF THE INVENTION

It is an object of the present invention to provide a bonding method in which the stoppage of operation of a device and the execution of manual correcting work, which are caused by a relative positional deviation of boards in the case of simultaneously processing a plurality of boards, are avoided, so that the production efficiency can be enhanced.

According to first aspect of the invention, it is provided a bonding method conducted by a bonding device, the bonding device including: a board support table having a plurality of holding portions for individually holding a plurality of boards including at least a first and a second board, the board support table being moved at least in the horizontal direction by a single positioning means; a holding state releasing means for individually releasing a holding state of the board held by the holding portion; a position detecting means for detecting positions of the plurality of boards on the board support table; and pressure bonding heads arranged corresponding to the respective boards held by the holding portion, for pressure bonding an object to be bonded by pressure to each board, the bonding method comprising: a step of detecting the positions of the plurality of boards on the board support table by the position detecting means; a first positioning step of positioning a first board at a pressure bonding head corresponding to the first board by the positioning means according to a result of detecting the positions obtained in the step of detecting the positions; a first pressure bonding step for pressure bonding an object to be bonded by pressure by the pressure bonding head corresponding to the first board which has been position; a first holding state releasing step of releasing a holding state of the first board, which is being bonded by pressure, by the holding state releasing means in the first pressure bonding step; a second positioning step of positioning the second board to the pressure bonding head corresponding to the second board by the positioning means according to a result of positional detection obtained in the position detecting step after the first holding state has been released; and a second pressure bonding step of pressure bonding an object to be bonded by pressure to the second board by the pressure bonding head corresponding to the second board which has been position.

According to second aspect of the invention, it is judged whether or not it is necessary to execute the first positioning step and the second positioning step according to the result of positional detection, when it is judged that a positional deviation of the board is in an allowable range, all boards are positioned with respect to the pressure bonding heads corresponding to the respective boards, and when it is judged that a positional deviation of the board exceeds an allowable range, the step proceeds to the first positioning step.

According to the present invention, in a bonding method of individually positioning and pressure bonding a plurality of boards including the first and the second board by a single positioning means to the respective pressure bonding heads, according to the result of positional detection obtained in the positional detection step, the first board is positioned to the corresponding pressure bonding head and the object to be bonded by pressure is bonded by pressure. In this pressure bonding step, under the condition that a state of holding the first board, which is bonded by pressure, is released by the holding state releasing means, the second board is positioned to the corresponding pressure bonding head. Due to the foregoing, it is possible to avoid the stoppage of operation of the device and the execution of manual correcting work, which are caused by a relative positional deviation of the board in the case of simultaneously processing a plurality of boards. Therefore, the production efficiency can be enhanced.

FIG. 6 is a schematic illustration for explaining operation of an assembling device of a display panel of an embodiment of the present invention.

DETAILED DESCRIPTION OF THE PREFERRED EMBODIMENTS

Figure 1:
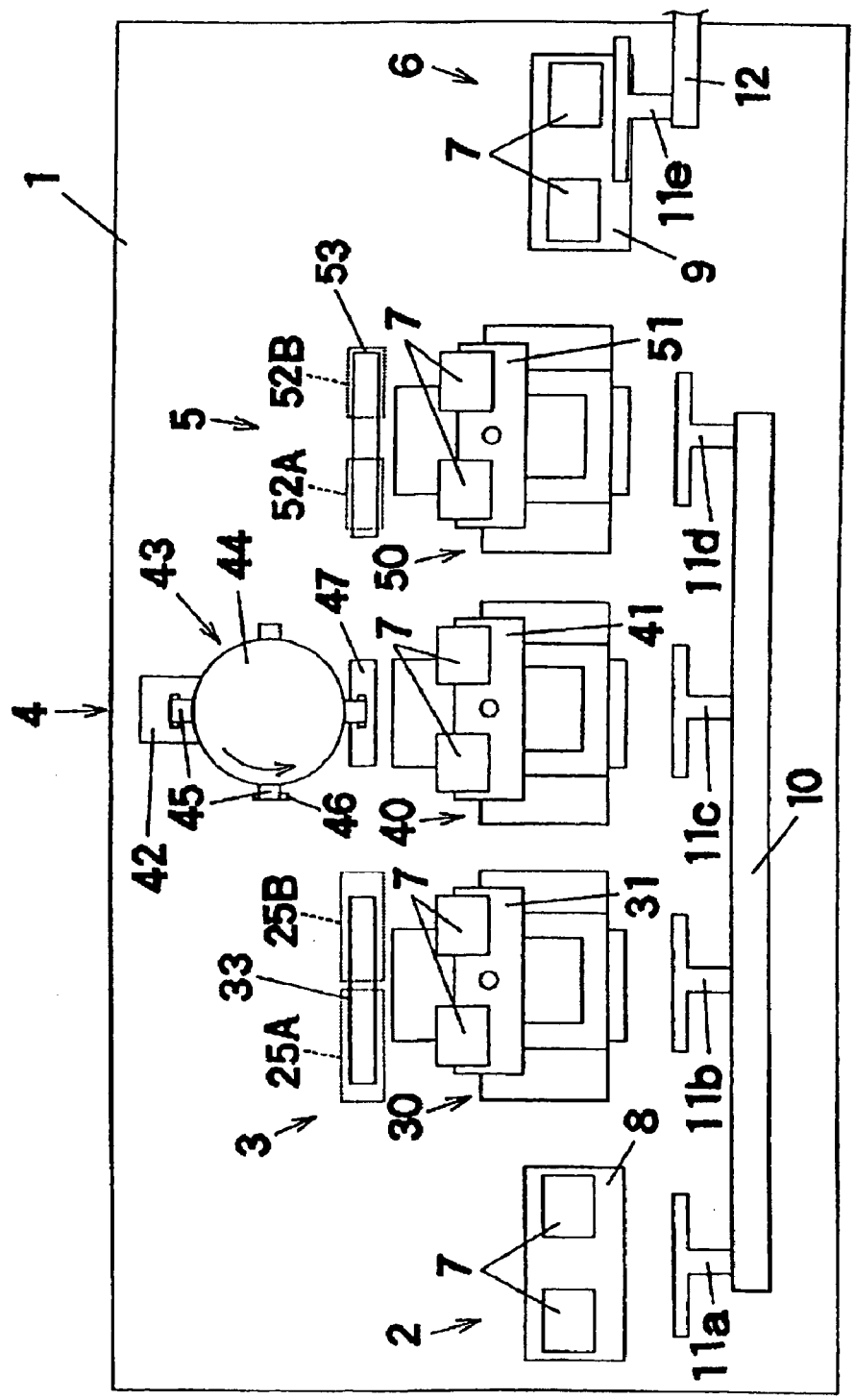
FIG. 1 is a plan view of an assembling device of a display panel of an embodiment of the present invention.
Figure 2:
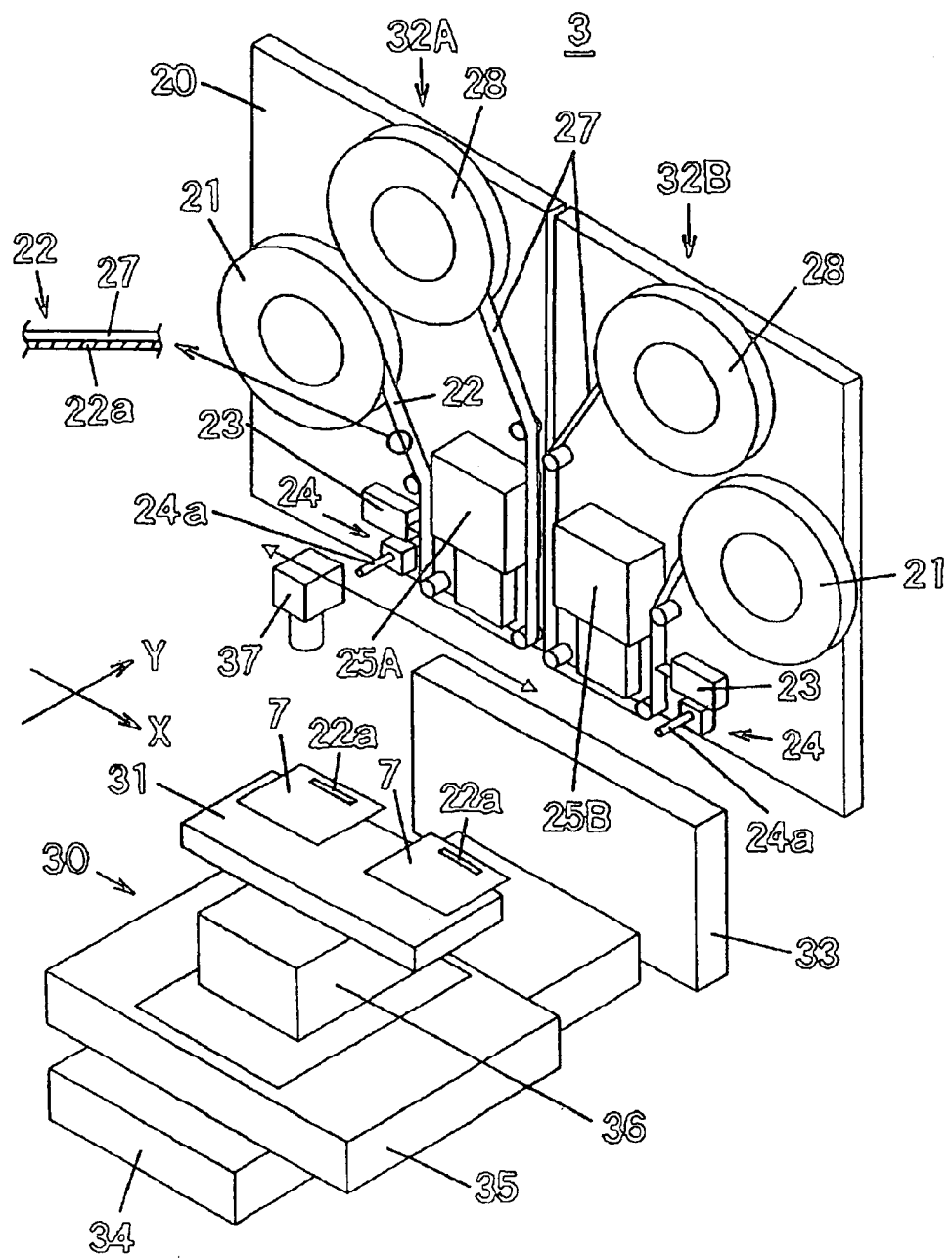
FIG. 2 is a perspective view of an adhesive tape bonding stage of an assembling device of a display panel of an embodiment of the present invention.
Figure 3:
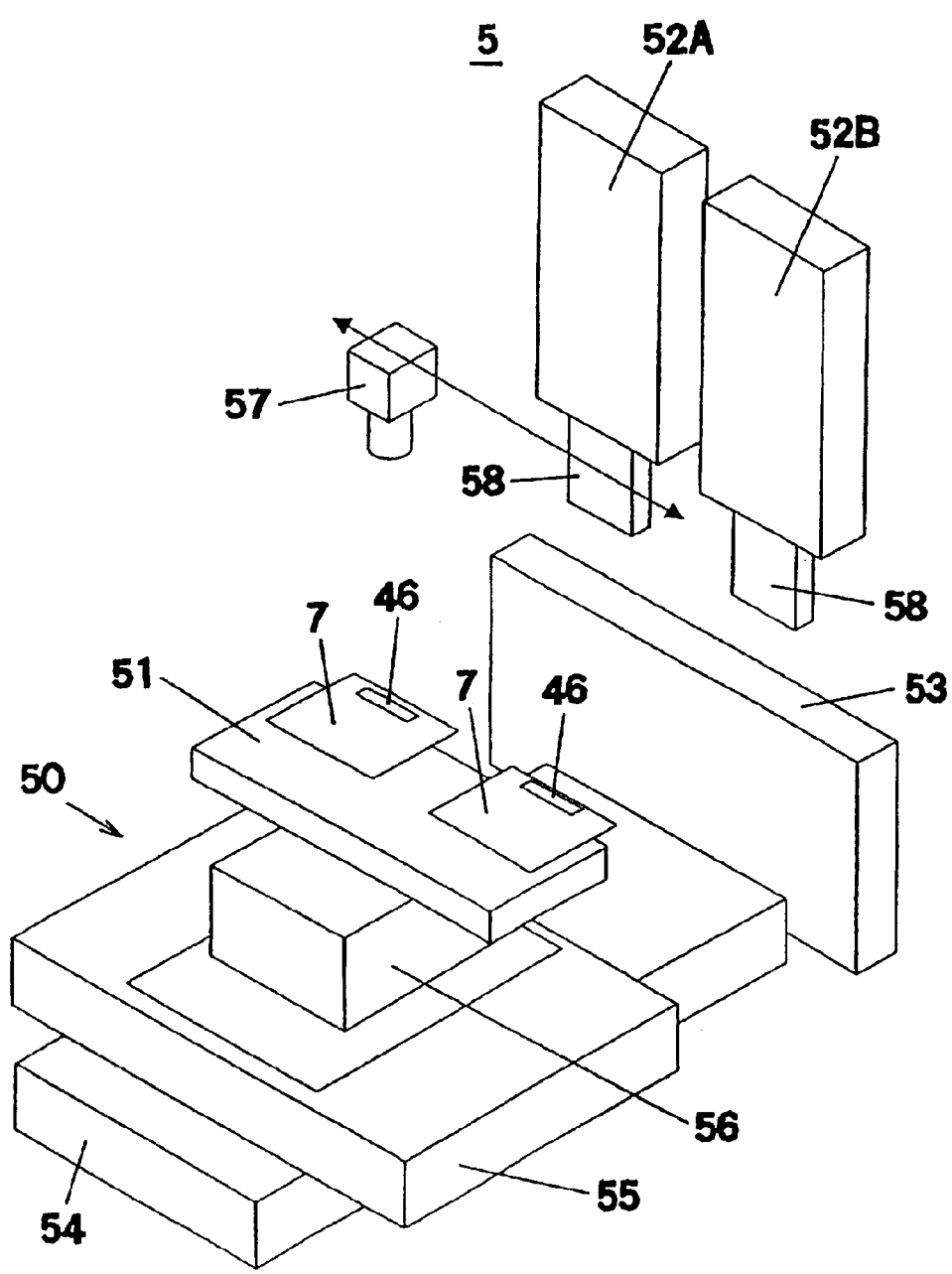
FIG. 3 is a perspective view of a final pressure bonding stage of an assembling device of a display panel of an embodiment of the present invention.
Figure 4:
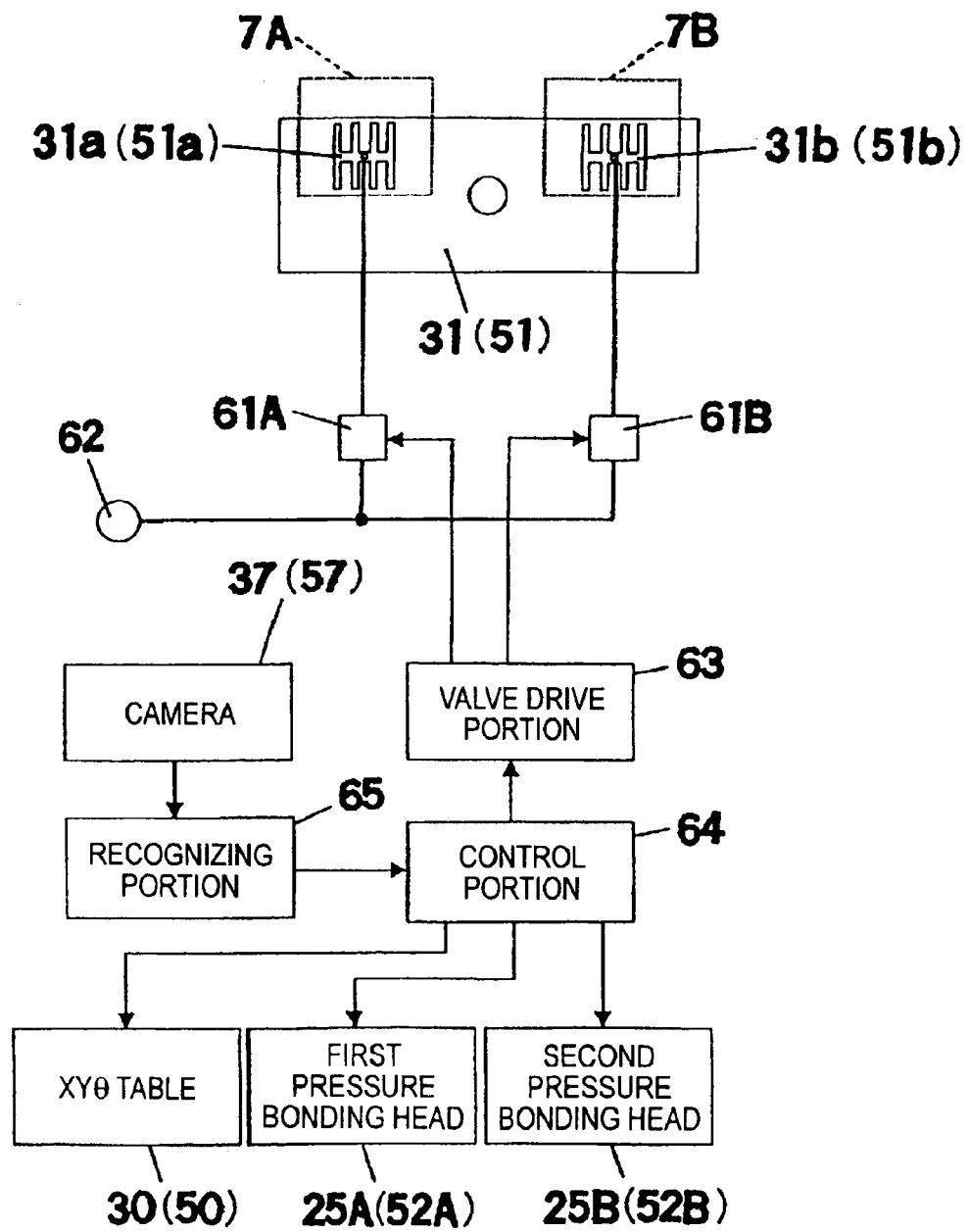
FIG. 4 is a block diagram showing the constitution of a control system of an assembling device of a display panel of an embodiment of the present invention.
Figure 5:
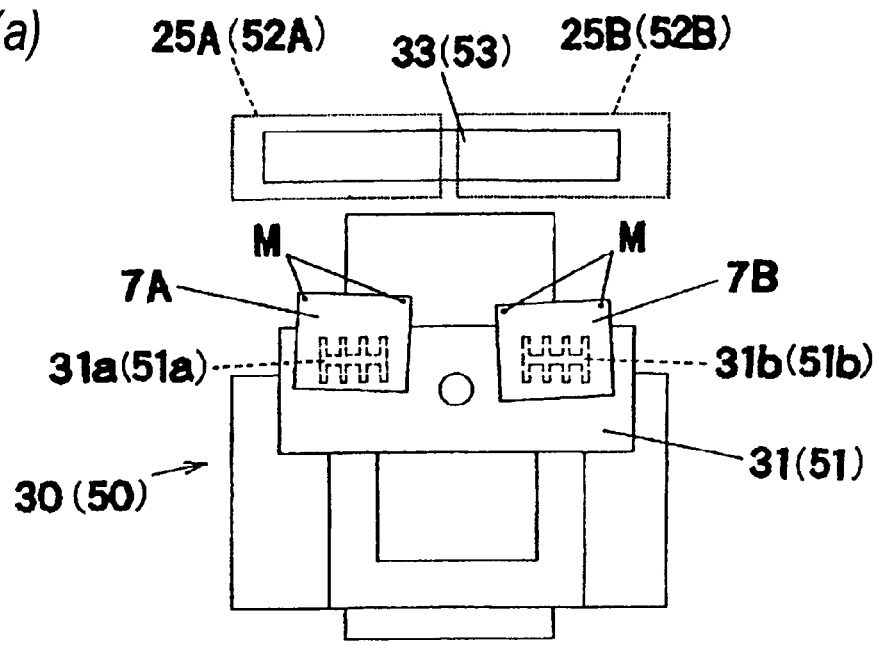
FIG. 5 is a schematic illustration for explaining operation of an assembling device of a display panel of an embodiment of the present invention.
Figure 5:
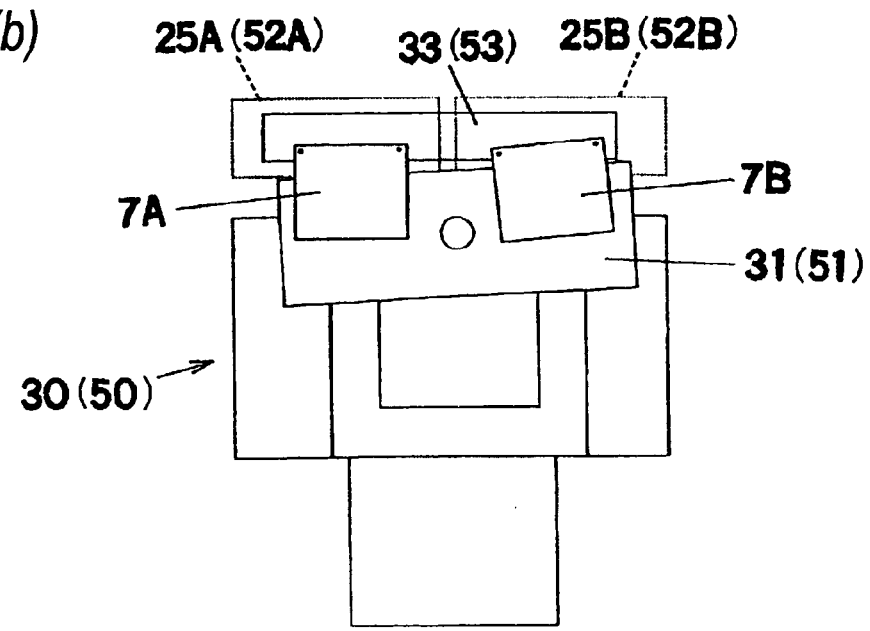
Figure 7:
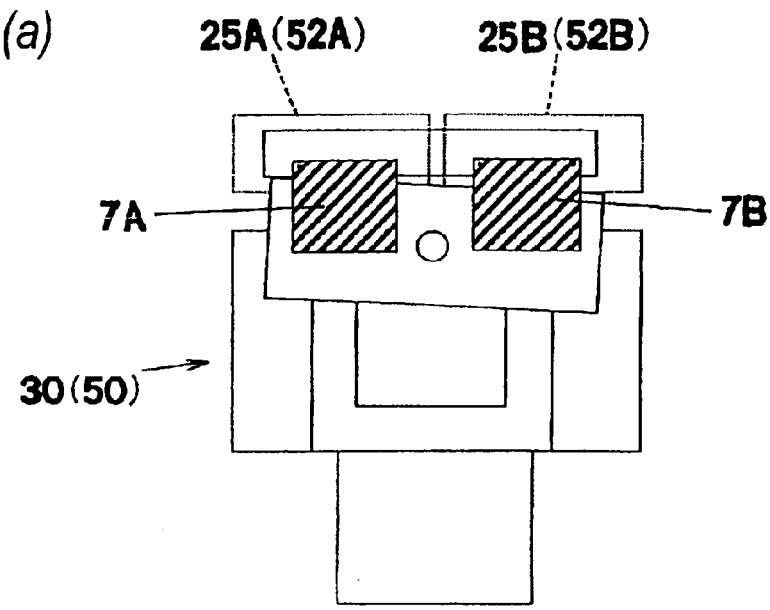
FIG. 7 is a schematic illustration for explaining operation of an assembling device of a display panel of an embodiment of the present invention.
Figure 7:
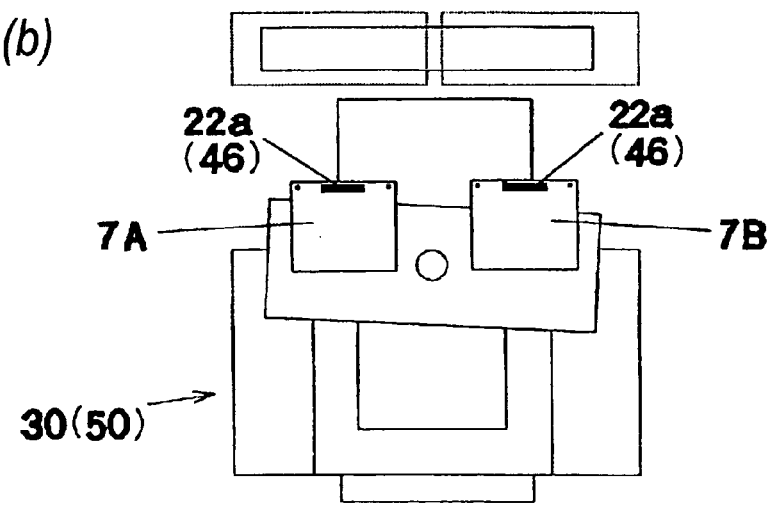

Next, referring to the drawings, an embodiment of the present invention will be explained below. FIG. 1 is a plan view showing an assembling device of assembling a display panel of an embodiment of the present invention, FIG. 2 is a perspective view of an adhesive tape bonding stage of the assembling device of assembling the display panel of the embodiment of the present invention, FIG. 3 is a perspective view of a final pressure bonding stage of the assembling device of assembling the display panel of the embodiment of the present invention, FIG. 4 is a block diagram showing the constitution of a control system of the assembling device of assembling the display panel of the embodiment of the present invention, and FIGS. 5, 6, 7, 8, 9 and 10 are schematic illustrations for explaining operation of the assembling device of assembling the display panel of the embodiment of the present invention.

First, referring to FIG. 1, an overall arrangement of the assembling device of assembling a display panel will be explained as follows. This assembling device assembles a display panel in such a manner that electronic parts for a driver are bonded by pressure to a glass board via an adhesive tape. In FIG. 1, on the base 1, there are provided a waiting stage 2, an adhesive tape bonding stage 3, an electronic parts mounting stage (provisional pressure bonding stage) 4, a final pressure bonding stage 5 and a conveyance stage 6 which are arranged in a line in the lateral direction. The waiting stage 2 has a panel setting table 8 on which two display panels 7, which are boards to which electronic parts are bonded, can be set. The two display panels 7 are positioned on the panel setting table 8 by a pre-center mechanism (not shown), so that the relative positions of the two display panels 7 can be adjusted.

The adhesive tape bonding stage 3 is composed as follows. The two display panels 7 are held by the panel support table 31 attached to the XYθ table 30. The adhesive tape 22a of a predetermined length is bonded to edge portions of the display panels 7 by the two adhesive tape pressure bonding heads 25A (first pressure bonding head) and 25B (second pressure bonding head). The lower receiving portion 33 is arranged below the adhesive tape pressure bonding heads 25A, 25B. In the case of bonding the adhesive tape, the XYθ table 30 is driven, and the edge portion of the display panel 7, which is held by the panel support table 31, is positioned on the lower receiving portion 33. While the edge portion of the display panel 7 is being received by the lower receiving portion 33, the adhesive tape pressure bonding heads 25A, 25B are lowered so as to bond the adhesive tape 22a.

In the electronic parts mounting stage 4, electronic parts for a driver are mounted on and bonded by pressure to the adhesive tape 22a which has been bonded to the display panel 7 in the adhesive tape bonding stage 3. In this case, when the holding head 45 provided on the index table 44 of the electronic parts mounting mechanism 43 is successively index-rotated in the direction of an arrow, the electronic part 46 taken out from the electronic part supply portion 42 is conveyed to a provisional pressure bonding position on the lower receiving portion 47. When the holding head 45 is lowered at the provisional pressure bonding position, the electronic part 46 is mounted on and provisionally bonded by pressure to the two display panels 7 held by the panel support table 41 which is attached to the XYθ table 40.

In the final pressure bonding stage 5, the two display panels 7 are held by the panel support table 51 mounted on the XYθ table 50. The electronic parts 46 provisionally bonded by pressure to these display panels 7 are finally bonded by pressure to the display panels 7 by the two final pressure bonding heads 52A (first pressure bonding head) and 52B (second pressure bonding head). The lower receiving portion 53 is arranged in a lower portion of the final pressure bonding heads 52A, 52B. In the case of final pressure bonding, the XYθ table 50 is driven, and the edge portion of the display panel 7 held by the panel support table 51 is moved to the lower receiving portion 53. Then, while the edge portion of the display panel 7 is being supported by the lower receiving portion 53, the final pressure bonding heads 52A, 52B are lowered so as to conduct the final pressure bonding.

The conveyance stage 6 is provided with a panel conveyance table 9. On the panel conveyance table 9, the display panel 7, on which the final pressure bonding has been conducted in the final pressure bonding stage 5, is put. On the front side of each working stage described above, there is provided a display panel conveyance mechanism 10 having a plurality of panel conveyance arms. When the display panel conveyance mechanism 10 is driven, by the display panel conveyance arms 11a, 11b, 11c, 11d, the two respective display panels 7 are simultaneously conveyed from the waiting stage 2 to the adhesive tape bonding stage 3, from the adhesive tape bonding stage 3 to the electronic parts mounting stage 4, from the electronic parts mounting stage 4 to the final pressure bonding stage 5, and from the final pressure bonding stage 5 to the conveyance stage 6. The display panel 7 on the panel conveyance table 9 in the conveyance stage 6 is conveyed out to the downstream side by the conveyance arm 11e of the panel conveyance mechanism 12.

Next, referring to FIG. 2, the adhesive tape bonding stage 3 will be explained below. In FIG. 2, the XYθ table 30 is composed of the Y table 34, X table 35 and θ table 36 which are put on each other. The panel support table 31 (the board support table) is attached to the and θ table 36. On the panel support table 31, there are provided two holding portions (the first panel holding portion 31a and the second panel holding portion 31b shown in FIG. 4) for individually holding the display panels 7, which are the boards, by means of vacuum suction.

In an upper portion of the XYθ table 30, there is provided a camera 37 capable of being moved in the direction X. The camera 37 takes photographs of the two display panels 7 on the panel support table 31. By taking the photographs, as described later, it is possible to recognize alignment marks M (shown in FIG. 5) provided on the display panels 7, and positions of the two display panels 7 can be detected. When the XYθ table 30 is driven according to the result of this positional detection, the panel support table 31 is moved in the horizontal direction, and the two display panels 7, which are held, can be positioned to the first adhesive tape pressure bonding head 25A and the second adhesive tape pressure bonding head 25B described later. The XYθ table 30 is a single positioning means for moving the panel support table 31 at least in the horizontal direction.

At the rear of the XYθ table 30, there is provided a lower receiving portion 33. The lower receiving portion 33 supports an edge portion of the display panel 7 from the lower portion in the case of bonding the adhesive tape. In an upper portion of the lower receiving portion 33, there are provided two tape bonding units 32A, 32B. Each tape bonding unit 32A, 32B is composed of the longitudinal frame 20 in which the adhesive tape supply reel 21, the adhesive tape cutting portion 23, the leader tape peeling mechanism 24, the first adhesive tape pressure bonding head 25A (or the second adhesive tape pressure bonding head 25B) and the leader tape recovery reel 28 are arranged.

The adhesive tape supply reel 21 supplies the laminated tape 22, which is wound in a coil state, to the downstream side. The laminated tape 22 is composed in such a manner that the adhesive tape 22a, on which electronic parts are bonded, is laminated on the leader tape 27 which becomes a base. The adhesive tape cutting portion 23 is provided with a cutting blade capable of retracting with respect to the laminated tape 22. The cutting blade cuts only the adhesive tape 22a on the laminated tape 22 which has been drawn out from the adhesive tape supply reel 21.

The first adhesive tape pressure bonding head 25A (or the second adhesive tape pressure bonding head 25B) comes into contact with an upper face of the laminated tape 22 and presses down the laminated tape 22 against an upper face of the display panel 7. In this way, the adhesive tape 22a on the lower face side of the laminated tape 22 is bonded by pressure to the display panel 7. In this case, the tape bonding units 32A and 32B are symmetrically arranged to each other, and the first adhesive tape pressure bonding head 25A and the second adhesive tape pressure bonding head 25B are arranged as close as possible.

The leader tape peeling mechanism 24 peels the leader tape 27 from the adhesive tape 22a, which is bonded to the display panel 7, with the pin 24a. The leader tape recovery tape 28 winds and recovers the leader tape 27 after it has been peeled off from the adhesive tape 22a.

Next, referring to FIG. 3, the final pressure bonding stage 5 will be explained below. In FIG. 3, the XYθ table 50 is composed of the Y table 54, the X table 55 and the θ table 56 which are put on each other. On the θ table 56, the panel support table 51 (the board support table) is attached. The panel support table 51 has two holding portions (the first panel holding portion 51a and the second panel holding portion 51b shown in FIG. 4) for holding the display panel 7 by vacuum suction. The respective panel holding portions 51a, 51b hold the display panel 7.

In an upper portion of the XYθ table 50, there is provided a camera 57 capable of being moved in the direction X. The camera 57 takes photographs of the two display panels 7 on the panel support table 51. By taking the photographs, as described later, it is possible to recognize alignment marks provided on the display panels 7, and positions of the two display panels 7 can be detected.

When the XYθ table 50 is driven according to the result of this positional detection, the panel support table 51 is moved in the horizontal direction, and the two display panels 7, which are held, can be positioned to the first final pressure bonding head 52A and the second final pressure bonding head 52B described later. The XYθ table 50 is a single positioning means for moving the panel support table 51 at least in the horizontal direction.

At the rear of the XYθ table 50, there is provided a lower receiving portion 53. The lower receiving portion 53 supports an edge portion of the display panel 7 from the lower portion. In an upper portion of the lower receiving portion 53, the first final pressure bonding head 52A and the second final pressure bonding head 52B, which are respectively provided with the pressure bonding tool 58 in the lower end portion, are arranged. The display panels 7, on which the electronic parts 46 are provisionally bonded by pressure to the adhesive tape in the electronic parts mounting stage 4, are respectively positioned to the first final pressure bonding head 52A and the second final pressure bonding head 52B, and the first final pressure bonding head 52A and the second final pressure bonding head 52B are lowered to the display panels 7, and when the pressing state is held for a predetermined pressure bonding time, the electronic parts 46 can be finally bonded by pressure to the display panels 7.

Next, referring to FIG. 4, the control system will be explained as follows. In this case, the bonding motion of bonding the adhesive tape 22a, which is an object to be bonded by pressure in the adhesive tape bonding stage 3, and the final pressure bonding motion of bonding the electronic parts 46, which are objects to be bonded by pressure in the final pressure bonding stage, are assumed to be a common pressure bonding motion, and the common components in these pressure bonding motions will be explained in FIG. 4. In FIG. 4, components attached with reference marks represent the common components in these two stages. For example, in the adhesive tape bonding stage 3, the first pressure bonding head is the first adhesive tape pressure bonding head 25A, and in the final pressure bonding stage 5, it is the first final pressure bonding head 52A. In the same manner, in the adhesive tape bonding stage 3, the second pressure bonding head is the second adhesive tape pressure bonding head 25B, and in the final pressure bonding stage 5, it corresponds to the second final pressure bonding head 52B.

In FIG. 4, on the panel support table 31 (51), the first panel holding portion 31a (51a) and the second panel holding portion 31b (51b) are arranged. The first panel holding portion 31a (51a) and the second panel holding portion 31b (51b) are provided with suction grooves formed on an upper face of the panel holding table 31 (51). While the display panel 7 is being put, the display panel 7 is sucked and held by the panel supporting table 31 (51) when vacuum suction is conducted by the suction groove.

The first panel holding portion 31a (51a) and the second panel holding portion 31b (51b) are respectively connected to the first valve 61A and the second valve 61B. Both the first valve 61A and the second valve 61B are connected to the negative pressure generating source 62. When the first valve 61A and the second valve 61B are opened and closed by the drive portion 63 which is controlled by the control portion 64, the holding state and the releasing state of the display panels 7, which are conducted by the first panel holding portion 31a (51a) and the second panel holding portion 31b (51b), can be individually changed over. The first valve 61A and the second valve 61B are respectively the first holding state releasing means and the second holding state releasing means.

The camera 37 (57) is connected to the recognizing portion 65. When photographing data of the two display panels 7 on the panel supporting table 31 (51) photographed by the camera 37 (57) is recognized by the recognizing portion 65, alignment marks M formed on the display panels 7 are recognized. Due to the foregoing, positions of the two display panels 7 can be detected. Accordingly, the camera 37 (57) and the recognizing portion 65 are a positional detecting means for detecting a plurality of display panels 7 on the panel supporting table 31 (51). The result of the positional detection conducted by the recognizing portion 65 is sent to the control portion 64.

The XYθ table 30 (50), the first adhesive tape pressure bonding head 25A (52A) and the second adhesive tape pressure bonding head 25B (52B) are connected to the control portion 64. When the control portion 64 controls the motions of the XYθ table 30 (50), the first adhesive tape pressure bonding head 25A (52A) and the second adhesive tape pressure bonding head 25B (52B) according to the result of the positional detection of the display panels 7, the bonding motions explained below are executed.

This display panel assembling device is composed as described above. The method of bonding conducted by this display panel assembling device will be explained as follows. The invention provides a bonding method conducted by a bonding device (an adhesive tape bonding stage or a final pressure bonding stage), and the bonding device includes: a panel support table 31 having a plurality of holding portions for individually holding a plurality of display panels 7 including at least display panels A and B, the panel support table being moved at least in the horizontal direction by an XYθ table which is a single positioning means; a holding state releasing means for individually releasing a holding state of the display panels 7 held by the respective holding portion; a position detecting means for detecting positions of the plurality of panels on the panel support table 31; and a first pressure bonding head (the first adhesive tape pressure bonding head 25A, the first final pressure bonding head 52A) and the second pressure bonding head (the second adhesive tape pressure bonding head 25B, the second final pressure bonding head 52B) arranged corresponding to the respective display panels held by the holding portion, for bonding an object to be bonded by pressure to each board.

In this case, an example is shown in which the two display panels of the first display panel (the first board) and the second display panel (the second board) are used as a plurality of display panels. In the following explanations, in order to distinguish these two display panels 7, they are described as display panel 7A and display panel 7B.

Referring to FIGS. 5 to 10, the method of bonding will be explained below. In this case, in order to explain both the motion in the adhesive tape bonding stage 3 and the motion in the final pressure bonding stage 5 by the same drawings, the common components are expressed by both reference marks of the adhesive tape bonding stage 3 and the final pressure bonding stage 5. In this case, explanations will be made under the condition that the first adhesive tape pressure bonding head 25A and the first final pressure bonding head 52A are the first pressure bonding heads, and the second adhesive tape pressure bonding head 25B and the second final pressure bonding head 52B are the second pressure bonding heads. First, in FIG. 5(a), the display panels 7A, 7B are transferred from the previous stage onto the panel supporting table 31 (51) and respectively sucked to and held by the first panel holding portion 31a (51a) and the second panel holding portion 31b (51b) by vacuum.

Under the above condition, the display panels 7A, 7B are photographed by the camera 37 (57), and alignment marks M are respectively recognized. Due to the foregoing, positions of the display panels 7A, 7B can be detected. According to the result of this positional detection, quantities of positional deviation of the respective display panels 7A, 7B (ΔXA, ΔYA, ΔθA), (ΔXB, ΔYB, ΔθB) are found (the position detecting step).

At this point of time, a quantity of positional deviation is judged. In this assembling device of assembling display panels, operation is conducted under the precondition that the two display panels 7A, 7B conveyed into the adhesive tape bonding stage 3 are previously positioned in the waiting stage 2 so that the relative positions between the two panels can be adjusted. However, there is a possibility that the display panels are conveyed into the adhesive tape bonding stage 3 while the relative positions of the display panels are deviating for some reasons. In the case where this positional deviation is large, it is impossible to simultaneously conduct positioning of the two display panels 7A, 7B by the same positioning motion. Therefore, the following judgment is conducted according to the result of the above positional detection.

First, it is judged whether or not the quantities of positional deviation of the respective display panels 7A, 7B (ΔXA, ΔYA, ΔθA), (ΔXB, ΔYB, ΔθB), which have been found, are in the allowable range. When it is judged that a difference between (ΔXA, ΔYA, ΔθA) and (ΔXB, ΔYB, ΔθB) is small and they are in the allowable range, the display panels 7A, 7B are simultaneously positioned to the first pressure bonding head (the first adhesive tape pressure bonding head 25A or the first final pressure bonding head 52A) and the second pressure bonding head (the second adhesive tape pressure bonding head 25B or the second final pressure bonding head 52B) by the same positioning motion.

When the XYθ table 30 (50) is driven according to the result of positional detection, the edge portions of the display panels 7A, 7B are respectively moved to predetermined positions of the lower portions of the first pressure bonding head and the second pressure bonding head. In this case, the average of (ΔXA, ΔYA, ΔθA) and (ΔXB, ΔYB, ΔθB) becomes a correction value of movement in the case of moving by the XYθ table 30 (50).

On the other hand, in the case where it is judged that a difference between the quantity of positional deviation (ΔXA, ΔYA, ΔθA) of the display panel 7A and the quantity of positional deviation (ΔXB, ΔYB, ΔθB) of the display panel 7B exceeds the allowable range and the display panel 7A, 7B can not be simultaneously positioned in the allowable range by the same positioning motion, the following individual positioning operation is conducted. As shown in FIG. 5(b), the display panel 7A (the first board) is positioned to the first pressure bonding head according to the quantity of positional deviation (ΔXA, ΔYA, ΔθA) (the first positioning step). When the display panel 7A is horizontally moved with respect to the first pressure bonding head by driving the XYθ table 30 (50), a quantity of movement of the display panel 7A is corrected by the quantity of positional deviation (ΔXA, ΔYA, ΔθA). Due to the foregoing, an edge portion of the display panel 7A is positioned to a predetermined lower position of the first pressure bonding head.

Next, as shown in FIG. 6(a), pressure bonding for the display panel 7A is started (the first pressure bonding step). That is, when the first pressure bonding head is lowered, the display panel 7A is interposed between the first pressure bonding head and an upper face of the lower receiving portion. In the process of pressure bonding of the display panel 7A, the first valve 61A is closed, and a holding state of the display panel 7A conducted by the first panel holding portion 31a (51a) is released (the first holding state releasing step). Due to the foregoing, the display panel 7A is allowed so that it can be relatively moved in the horizontal direction with respect to the panel support table 31 (51).

Next, the display panel 7B (the second board) is positioned. That is, when the XYθ table 30 (50) is driven according to the quantities of positional deviation (ΔXA, ΔYA, ΔθA) and (ΔXB, ΔYB, ΔθB), the display panel 7B is positioned to the second pressure bonding head (the second positioning step). In this case, by the positioning of the display panel 7A, the panel support table 30 (50) has already been corrected from the state, in which the position was recognized by the camera 37 (57), by a distance and angle corresponding to the quantity of positional deviation (ΔXA, ΔYA, ΔθA). Therefore, (ΔXB−ΔXA, ΔYB−ΔYA, ΔθB−ΔθA) becomes a new quantity of movement of correction of the XYθ table 30 (50).

Then, as shown in FIG. 7(a), pressure bonding for the display panel 7B is started (the second pressure bonding step). That is, when the second pressure bonding head is lowered, the display panel 7B is interposed between the second pressure bonding head and an upper face of the lower receiving portion. After a predetermined pressure bonding time of the display panel 7A and that of the display panel 7B have passed, the first and the second pressure bonding head are successively raised so as to release the pressure bonding state. In this case, the second pressure bonding head is raised being delayed behind the first pressure bonding head by the time required for the first holding state releasing step and the second positioning step. After both the two display panels 7A and 7B have been bonded by pressure, as shown in FIG. 7(b), the XYθ table 30 (50) is driven, so that the panel support table 31 (51) is retracted to a conveyance position.

Figure 8:
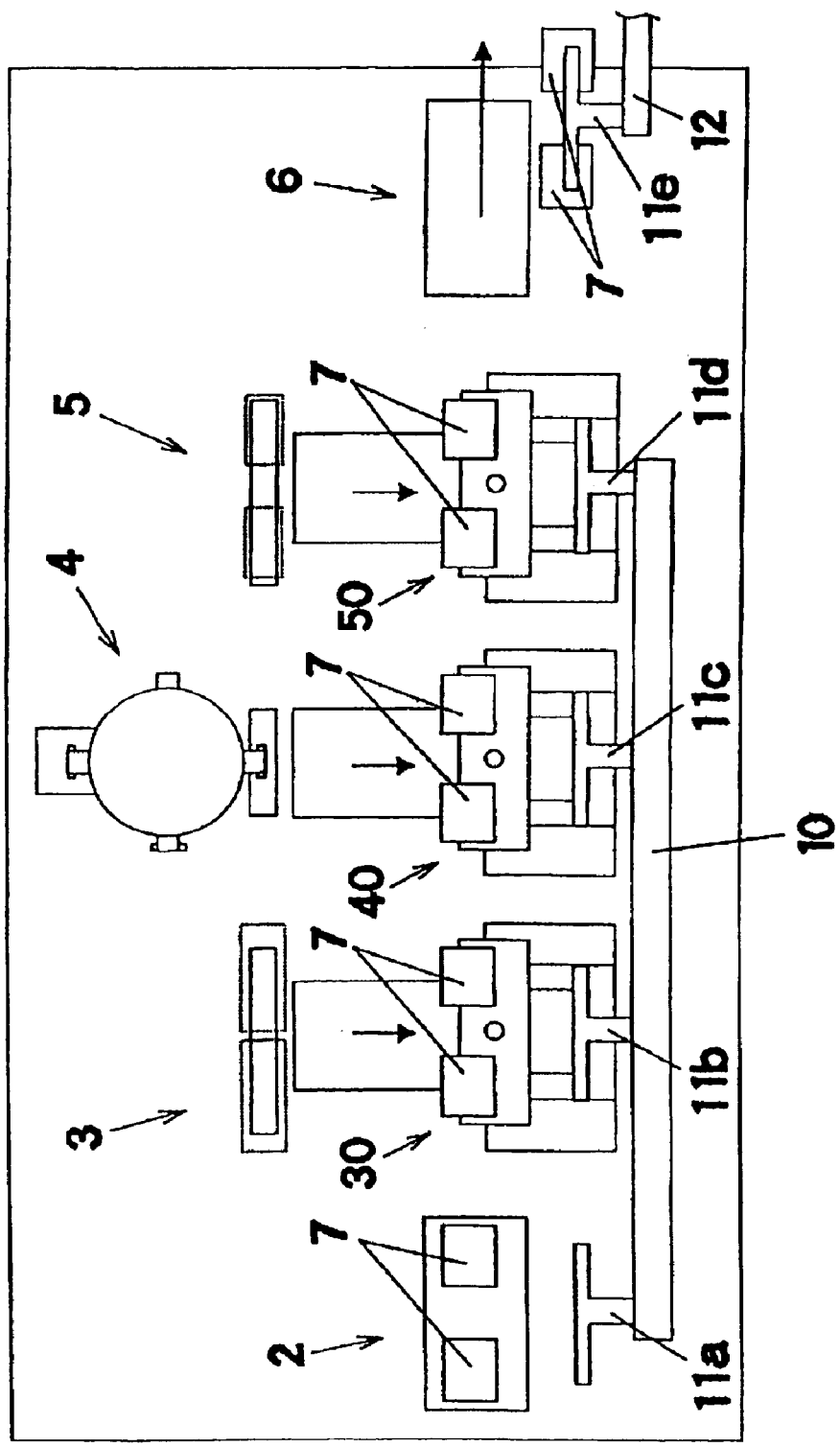
FIG. 8 is a schematic illustration for explaining operation of an assembling device of a display panel of an embodiment of the present invention.
Figure 9:
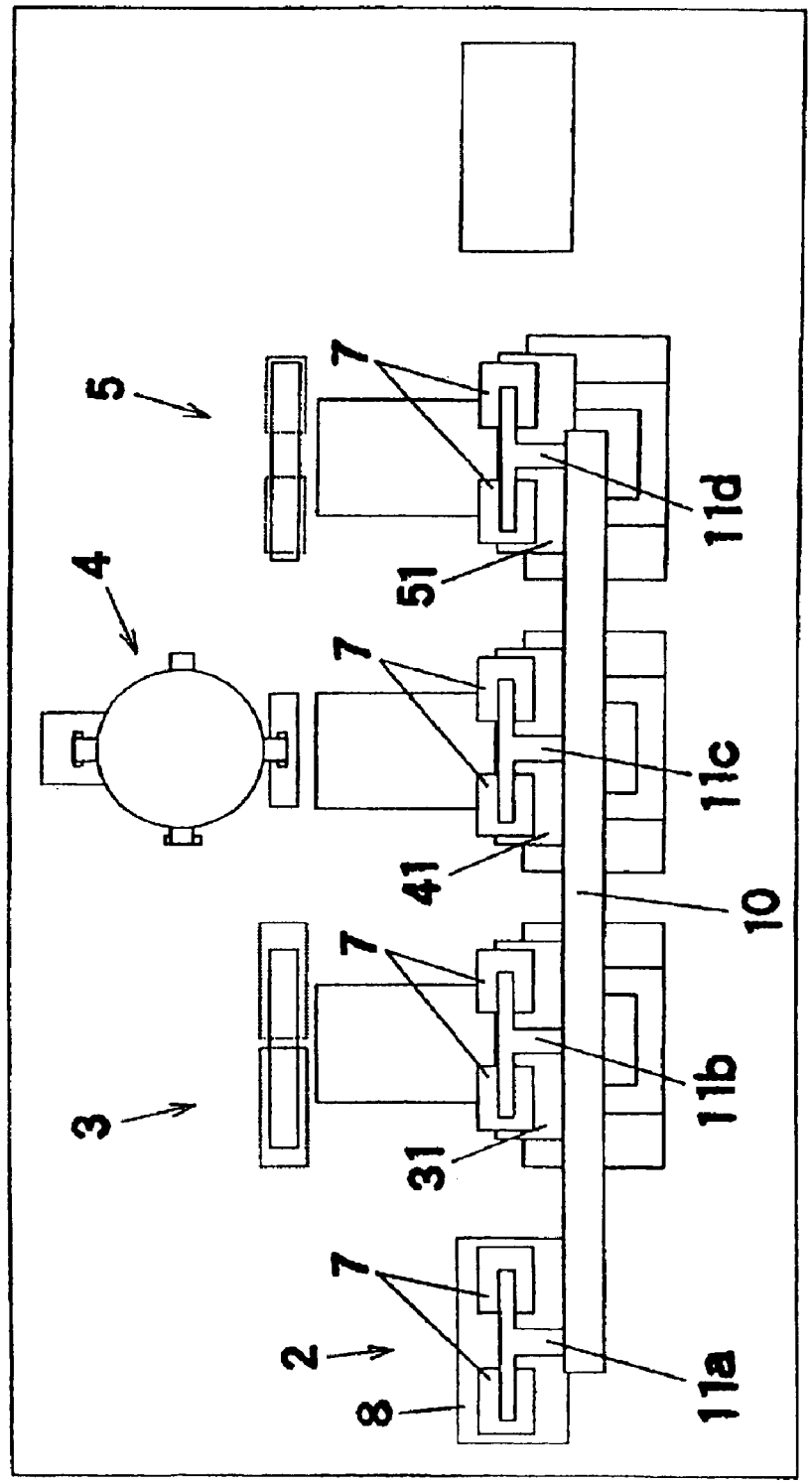
FIG. 9 is a schematic illustration for explaining operation of an assembling device of a display panel of an embodiment of the present invention.

After the work has been completed in the adhesive tape bonding stage 3, the electronic parts mounting stage 4 and the final pressure bonding stage 5, as shown in FIG. 8, the panel support tables 31, 41, 51 are returned to the conveyance positions. Next, as shown in FIG. 9, the panel conveyance mechanism 10 proceeds, and the panel conveyance arms 11a, 11b, 11c, 11d are respectively located on the panel mounting table 8 and the panel supporting tables 31, 41, 51.

Figure 10:
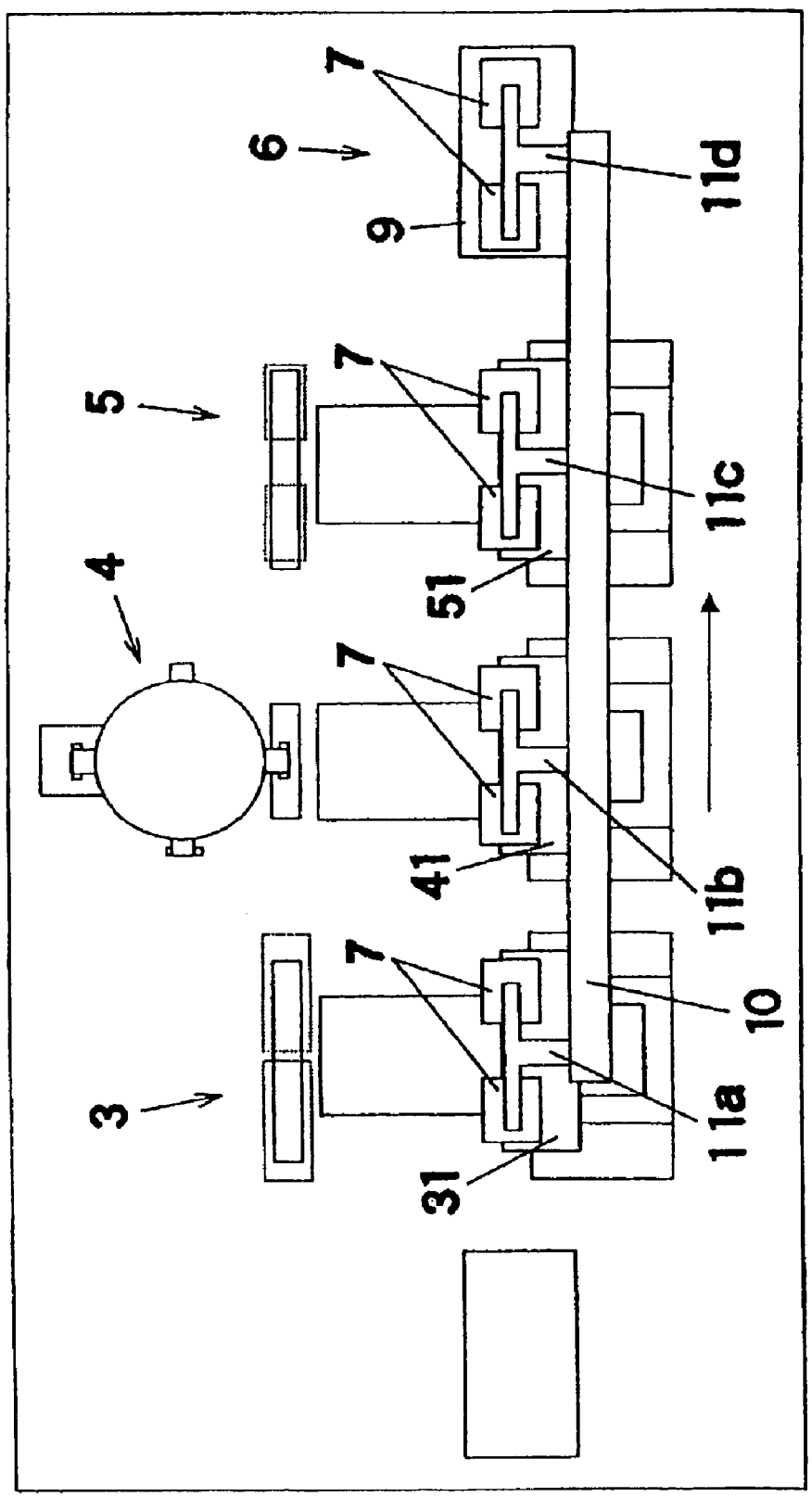
FIG. 10 is a schematic illustration for explaining operation of an assembling device of a display panel of an embodiment of the present invention.

In this case, when the panel conveyance arms 11a, 11b, 11c, 11d are moved upward and downward, each panel conveyance arm holds the two display panels 7 in the each stage. After that, as shown in FIG. 10, when the panel conveyance mechanism 10 is moved to right, the panel conveyance arms 11a, 11b, 11c, 11d are respectively moved to the panel support tables 31, 41, 51 and the panel conveyance table 9. In this case, when each panel conveyance arm is moved upward and downward, the display panels 7 are conveyed from the working stage on the upstream side to the panel support tables 31, 41, 51 and the panel conveyance table 9.

As explained above, even when the relative relations of the plurality of display panels 7 conveyed into the working stage deviate exceeding the allowable range, the individual display panels can be adjusted being individually positioned with respect to the working head. Therefore, it is unnecessary for a worker to stop the device and manually adjust the positional deviation of the display panels 7. Accordingly, in the case where a plurality of display panels are simultaneously processed, it is possible to avoid the stoppage of operation of the device and also it is possible to avoid the manual adjusting work caused by the positional deviation of the display panels 7.

In this connection, in the above embodiment, two display panels are taken up as an example of the plurality of boards. However, the present invention can be applied to a case in which the display panels 7, the number of which is not less than three, are processed as the plurality of boards. Even in this case, according to the predetermined order of pressure bonding, the display panels are successively positioned to the pressure bonding heads, and pressure bonding motions are conducted after the completion of the positioning motions. While the preceding board is being bonded by pressure, the position holding state of the board concerned is released, and the succeeding board is positioned under the condition that a relative movement of the panel holding table with respect to the board concerned is allowed.

According to the present invention, in a method of bonding in which a plurality of boards including a first and a second board are respectively positioned to pressure bonding heads by a single positioning means so as to bond the boards by pressure, according to the result of positional detection obtained in a positional detection step, positioning is conducted on a pressure bonding head corresponding to the first board and an object to be bonded is bonded by pressure. In this pressure bonding step, under the condition that a holding state of holding the first board, which is being bonded by pressure, is released by a holding state releasing means, positioning is conducted on a pressure bonding head corresponding to the second board. Accordingly, in the case where a plurality of display panels are simultaneously processed, it is possible to avoid the stoppage of operation of the device and also it is possible to avoid the manual adjusting work caused by the positional deviation of the display panels.

What is claimed is:

1. A bonding method conducted by a bonding device including: a board support table having a plurality of holding portions for individually holding a plurality of boards including at least a first and a second board, the board support table being moved at least in the horizontal direction by a single positioning means; a holding state releasing means for individually releasing a holding state of the board held by the holding portion; a position detecting means for detecting positions of the plurality of boards on the board support table; a plurality of pressure bonding heads arranged corresponding to the respective boards held by the holding portion, for pressure bonding an object to be bonded by pressure to an upper face of each board from an upper portion; and a lower supporting portion for supporting the board from a lower portion in the case of pressure bonding conducted by the pressure bonding head, the bonding method comprising:

a step of detecting the positions of the plurality of boards, which are held on the board support table, by the position detecting means;

a first positioning step of positioning a first board with respect to a first pressure bonding head corresponding to the first board by the positioning means according to a result of detecting the positions obtained in the step of detecting the positions;

a first pressure bonding step for pressure bonding an object to be bonded by pressure to the first board by the first pressure bonding head when the first board, which has positioned, is interposed between the first pressure bonding head and the lower receiving portion;

a first holding state releasing step of releasing a holding state of the first board, which is being bonded by pressure, by the holding state releasing means in the first pressure bonding step;

a second positioning step of positioning the second board to the second pressure bonding head corresponding to the second board by the positioning means according to a result of positional detection obtained in the position detecting step after the first holding state has been released; and a second pressure bonding step of pressure bonding an object to be bonded by pressure to the second board by the second pressure bonding head corresponding to the second board which has been positioned.

2. A bonding method according to claim 1, wherein it is judged whether or not it is necessary to execute the first positioning step and the second positioning step according to the result of positional detection, when it is judged that a positional deviation of the board is in an allowable range, all boards are positioned with respect to the pressure bonding heads corresponding to the respective boards, and when it is judged that a positional deviation of the board exceeds an allowable range, the step proceeds to the first positioning step.

3. A bonding method according to claim 1, wherein the holding portion holds the board by means of vacuum suction.

4. A bonding method according to claim 1, wherein the board is a display panel, and the object to be bonded by pressure is an adhesive tape.

5. A bonding method according to claim 1, wherein the board is a display panel, and the object to be bonded by pressure is an electronic part.

* * * * *